United States Patent
Tu et al.

(10) Patent No.: US 9,240,428 B1
(45) Date of Patent: Jan. 19, 2016

(54) IMAGE SENSOR AND MANUFACTURING METHOD THEREOF

(71) Applicant: VisEra Technologies Company Limited, Hsin-Chu (TW)

(72) Inventors: Zong-Ru Tu, Keelung (TW); Yu-Kun Hsiao, Hsin-Chu (TW)

(73) Assignee: VisEra Technologies Company Limited, Hsin-Chu (TW)

(*) Notice: Subject to any disclaimer, the term of this patent is extended or adjusted under 35 U.S.C. 154(b) by 0 days.

(21) Appl. No.: 14/326,912

(22) Filed: Jul. 9, 2014

(51) Int. Cl.
*H01L 31/0232* (2014.01)
*H01L 27/146* (2006.01)
*H04N 5/243* (2006.01)
*H04N 9/04* (2006.01)

(52) U.S. Cl.
CPC .... *H01L 27/14621* (2013.01); *H01L 27/14627* (2013.01); *H01L 27/14685* (2013.01); *H04N 5/243* (2013.01); *H04N 9/045* (2013.01)

(58) Field of Classification Search
CPC .. G02B 5/201; G02B 5/085; H01L 27/14685; H01L 27/14621; H01L 27/14627; H01L 27/14609; H01L 27/14629; H01L 27/14605
USPC .......................................... 257/440, E27.132
See application file for complete search history.

(56) References Cited

U.S. PATENT DOCUMENTS

| 2009/0147101 A1* | 6/2009 | Tatani et al. ............... 348/224.1 |
| 2009/0284840 A1* | 11/2009 | DeVoe et al. ................. 359/626 |
| 2011/0298074 A1* | 12/2011 | Funao ........................... 257/432 |

* cited by examiner

*Primary Examiner* — Shaun Campbell
(74) *Attorney, Agent, or Firm* — Muncy, Geissler, Olds & Lowe, P.C.

(57) ABSTRACT

Embodiments of an image sensor are provided. The image sensor includes a sensing layer, a filter unit and a microlens. The filter unit is disposed on the sensing layer, and the microlens is disposed on the filter unit. The filter unit has a gradient refractive index. Therefore, the sensitivity of the image sensor is improved.

14 Claims, 13 Drawing Sheets

US 9,240,428 B1

IMAGE SENSOR AND MANUFACTURING METHOD THEREOF

BACKGROUND OF THE INVENTION

1. Field of the Invention

The present disclosure relates to an image sensor, and in particular to an image sensor having a filter unit.

2. Description of the Related Art

In general, a digital camera utilizes an image sensor to sense light and generate an image signal, and thus a picture taken by the digital camera can be generated according to the image signal.

With the development of digital cameras, a high quality of image signals is requested. The quality of image signals is important, especially when the digital camera is used in a low-luminance environment.

Although image sensors have been generally adequate for their intended purposes, they have not been entirely satisfactory in all respects. Consequently, it would be desirable to provide a solution for improving image sensors.

BRIEF SUMMARY OF THE INVENTION

The present disclosure provides an image sensor and a manufacturing method for improving the quality of image signals generated by the image sensor.

The present disclosure provides an image sensor including a sensing layer, a filter unit and a microlens. The filter unit is disposed on the sensing layer, and the microlens is disposed on the filter unit. The filter unit has a gradient refractive index.

The present disclosure provides a manufacturing method of image sensors that includes forming a filter unit on a sensing layer and emitting a light beam to the filter unit to give the filter unit a gradient refractive index. The manufacturing method also includes forming a microlens on the filter unit.

The present disclosure also provides a manufacturing method of image sensors includes forming a filter unit on a sensing layer by stacking a plurality of materials thereon and forming a microlens on the filter unit. The filter unit has a gradient refractive index. Each of the materials has a refractive index lower than the refractive index of the material below it.

In conclusion, the sensitivity of the image sensor of the present disclosure is improved by the filter unit having a gradient refractive index. Therefore, the image signals generated by the image sensor are improved, especially in a low-luminance environment.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
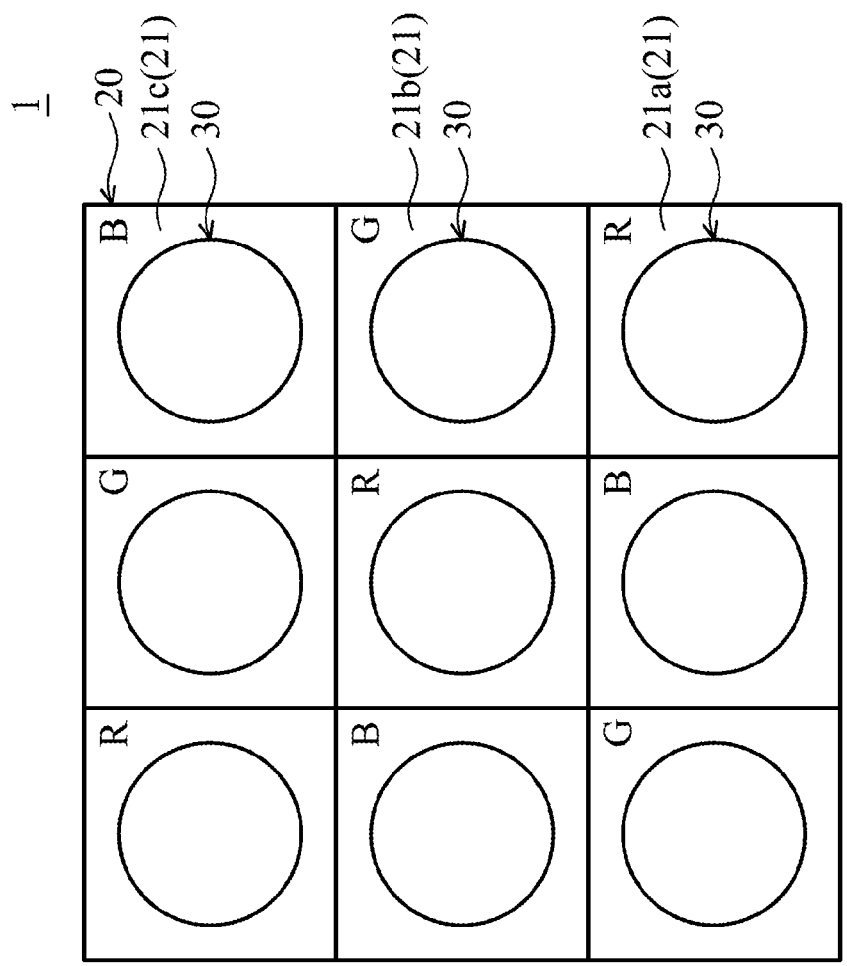
FIG. 1 is a top view of an image sensor in accordance with the present disclosure.
Figure 2:
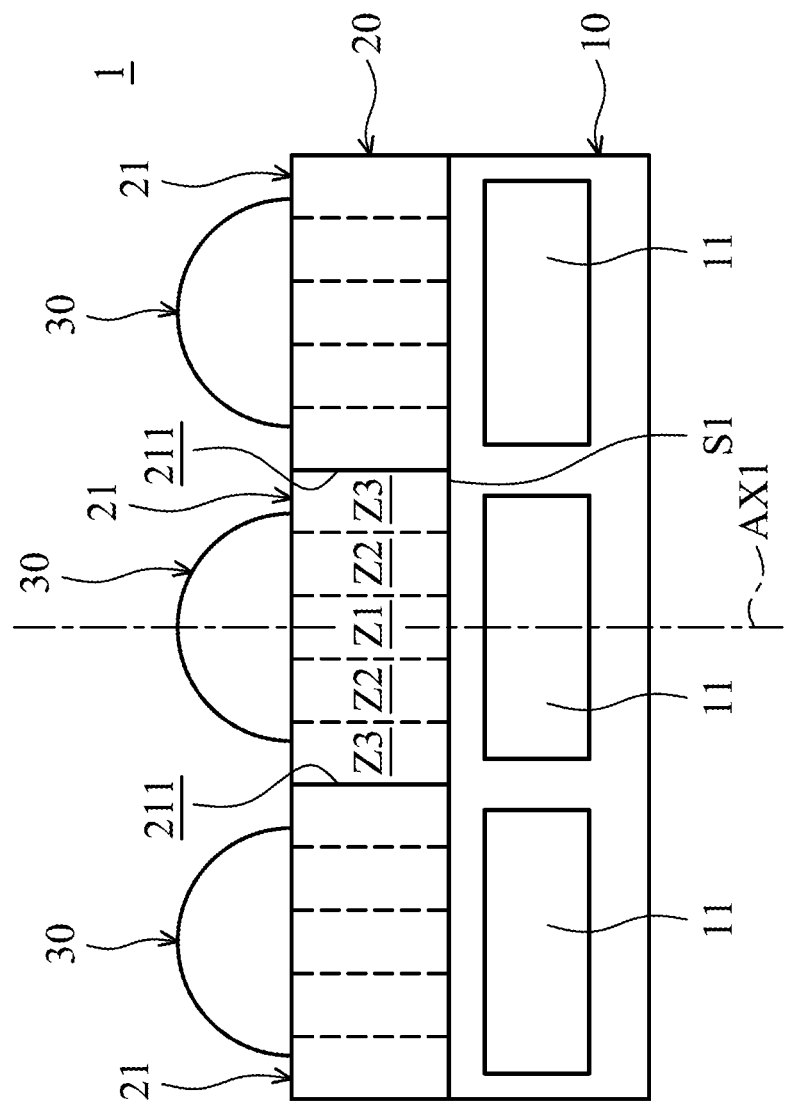
FIG. 2 is a cross-sectional view of the image sensor in accordance with a first embodiment of the present disclosure.

FIG. 1 is a top view of an image sensor 1 in accordance with the present disclosure. FIG. 2 is a cross-sectional view of the image sensor 1 in accordance with a first embodiment of the present disclosure. The image sensor 1 can be applied to an image apparatus, such as a digital camera. The image sensor 1 is used to sense light and generate an image signal according to the light falling on the image sensor 1.

The image sensor 1 includes a sensing layer 10, a filter layer 20 and a number of microlenses 30. The filter layer 20 is disposed on the sensing layer 10. The microlenses 30 are disposed on the filter layer 20 in an array.

Furthermore, the sensing layer 10 includes a number of sensing units 11 arranged in an array. In some embodiments, the sensing units 11 are photodiode. In some embodiments, the sensing layer 10 further includes an anti-leakage layer, an anti-reflection layer, and/or other optional layers (not shown in figures). The filter layer 20 includes a number of filter units 21 arranged in an array. Each of the filter units 21 is disposed over one of the sensing units 11, and each of the microlenses 30 is disposed on one of the filter units 21.

When a light falls on the image sensor 1, the light passes through the microlenses 30 and the filter units 21 to the sensing units 11. The light is focused by the microlenses 30. Each of the filter units 21 allows a predetermined range of wavelengths of the light to pass. Each of the sensing units 11 generates an intensity signal according to the intensity of the light falling thereon, and the image signal is formed by the intensity signals.

The filter units 21 are color filter units 21. For example, the filter units 21 include a number of red filter units 21a, a number of green filter units 21b, and a number of blue filter units 21c as shown in FIG. 1. The red filter units 21a, the green filter units 21b, and the blue filter units 21c are alternately arranged. The red filter units 21a allow wavelengths of light in a range from 620 nm to 750 nm to pass. The green filter units 21b allow wavelengths of light in a range from 495 nm to 570 nm to pass. The blue filter units 21c allow wavelengths of light in a range from 476 nm to 495 nm to pass.

The filter unit 21 includes photopolymer. Each of the filter units 21 has a gradient refractive index. The gradient refractive index is in a range from about 1.4 to about 1.9. The gradient refractive index has a maximum value and a minimum value, and the difference between the maximum value and the minimum value is in a range from about 0.07 to about 0.5. In some embodiments, the maximum value is in a range from about 1.5 to about 1.9, and the minimum value is in range from about 1.4 to about 1.8.

As shown in FIG. 2, the gradient refractive index is symmetric at a distance from a central vertical axis AX1 of the filter unit 21. The central vertical axis AX1 is perpendicular to a boundary surface S1 between the sensing layer 10 and the filter layer 20. The sensing layer 10 and the filter layer 20 are parallel to boundary surface S1.

The gradient refractive index adjacent to the central vertical axis AX1 is greater than the gradient refractive index adjacent to a side wall 211 of the filter unit 21. The side wall 211 is perpendicular to the boundary surface S1. In other words, the gradient refractive index at or adjacent to the central vertical axis AX1 has the maximum value. The gradient refractive index at or adjacent to the side wall 211 has the minimum value.

For example, the filter unit 21 has a first area Z1, a second area Z2 and a third area Z3. The first area Z1 (center area) is located at the central vertical axis AX1 (or the center of the filter unit 21), and has a first mean refractive index. The second area Z2 is located between the first area Z1 and the third area Z3, and has a second mean refractive index. The third area Z3 is adjacent to the side wall 211 of the filter unit 21, and has a third mean refractive index.

The first mean refractive index is greater than the second mean refractive index, and the second mean refractive index is greater than the third mean refractive index. For example, the first mean index is about 1.7, the second mean index is about 1.65, and the third mean index is about 1.60.

The microlens 30 includes photopolymer. The microlens 30 has a single refractive index. The refractive index of the microlens 30 is in a range from about 1.4 to about 1.9.

Figure 3:
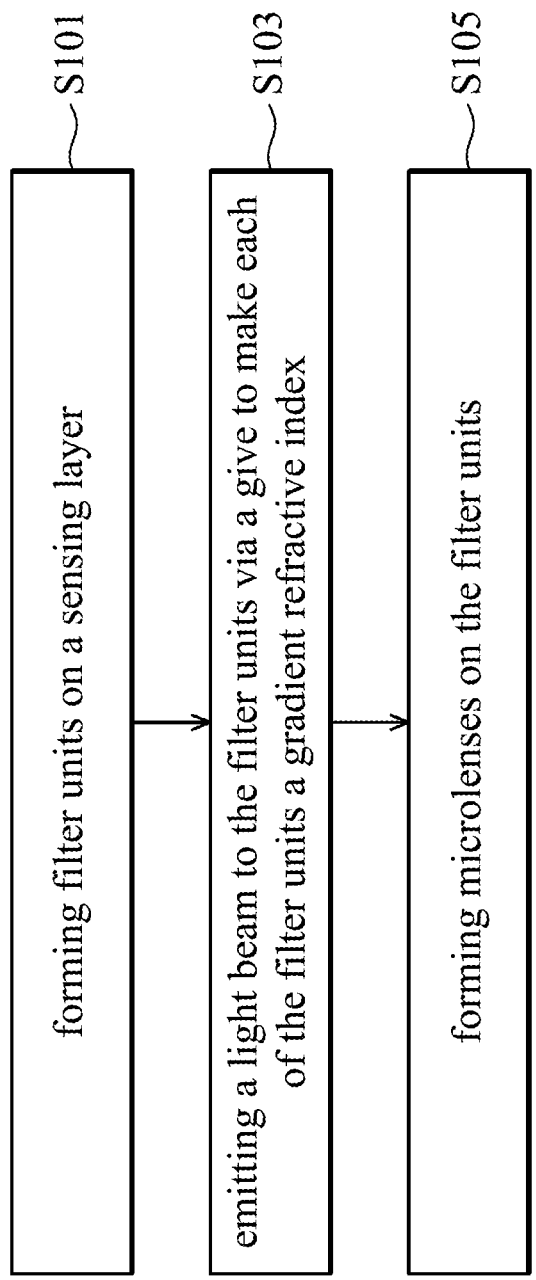
FIG. 3 is a flow chart of the manufacturing method of the image sensor in accordance with the first embodiment of the present disclosure.
Figure 4:
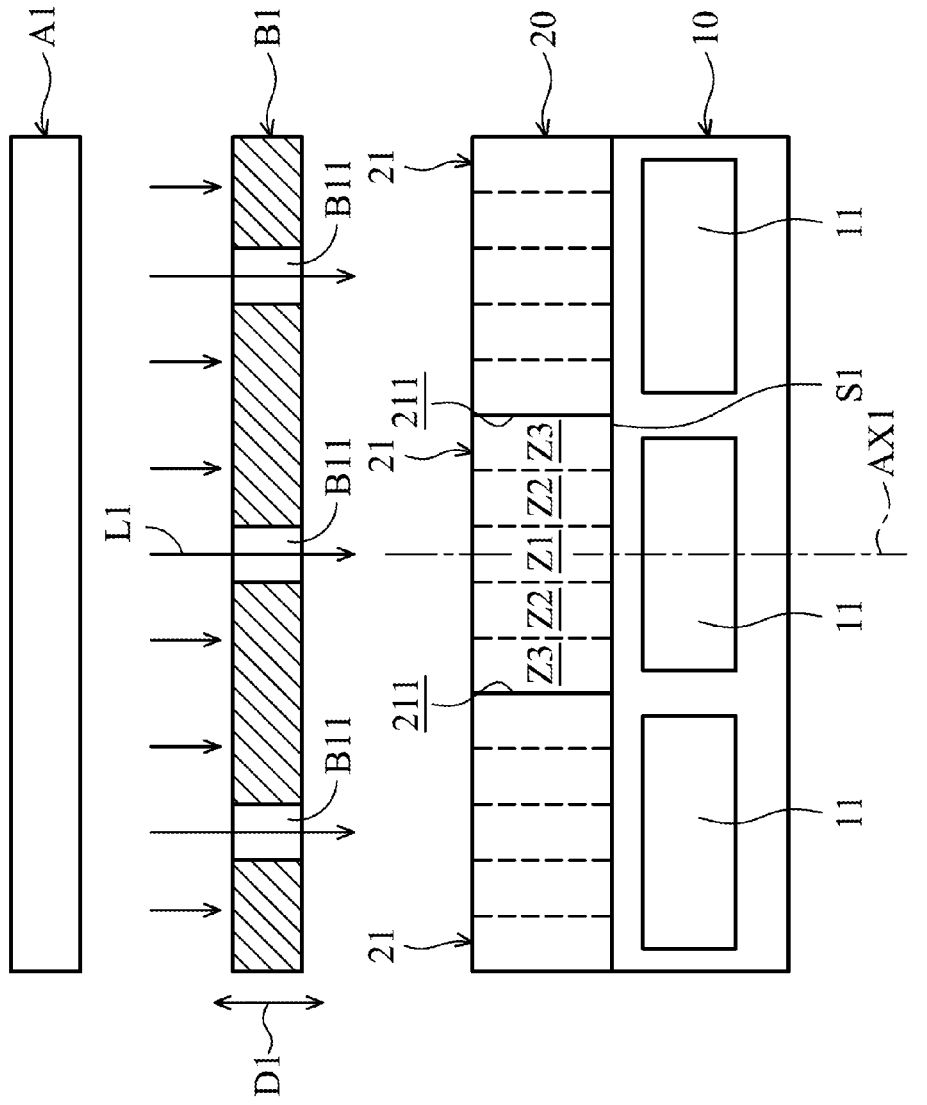
FIG. 4 is a schematic view of the manufacturing method of the image sensor during an intermediate stage in accordance with the first embodiment of the present disclosure.

FIG. 3 is a flow chart of the manufacturing method of the image sensor 1 in accordance with the first embodiment of the present disclosure. FIG. 4 is a schematic view of the manufacturing method of the image sensor 1 during an intermediate stage in accordance with the first embodiment of the present disclosure. In step S101, the filter units 21 of the filter layer are formed on the sensing layer 10. In step S103, a light beam L1 is emitted on the filter units 21 via a mask B1 to give each filter unit 21 a gradient refractive index. In step S105, the microlens 30 is formed on the filter units 21 as shown in FIGS. 1 and 2.

Regarding step S103, as shown in FIG. 4, the light source A1 is disposed upon the filter layer 20. The mask B1 is disposed upon the filter layer 20, and located between the light source A1 and the filter layer 20. The light source A1 emits the light beam L1 along an emitting direction D1. The emitting direction D1 is parallel to the central vertical axis AX1, and perpendicular to the boundary surface S1.

The mask B1 is perpendicular to emitting direction D1, and parallel to the boundary surface S1. The mask B1 has a number of holes B11 extended along the emitting direction D1. Each of the holes B11 corresponds to one of the center areas Z1 (first area) of the filter units 21. As shown in FIG. 4, the holes B11, the center areas Z1 are located at the central vertical axis AX1.

The light beam L1 is emitted to the mask B1 and passes through the holes B11, and than is emitted to the filter units 21 of the filter layer 20.

In some embodiments, since the filter unit 21 includes photopolymer, when the filter unit 21 is irradiated by the light beam L1, a chemical reaction occurs at the photopolymer, and the refractive index of the filter unit 21 is changed according to the intensity of the light beam L1.

As shown in FIG. 4, the intensity of the light beam L1 emitted to the filter unit 21 is gradually decreased from the central area Z1 to the side wall 211, and thus the filter unit 21 has the gradient refractive index, which is symmetric at a distance from the central vertical axis AX1 of the filter unit 21. Furthermore, the gradient refractive index is gradually decreased from the central vertical axis AX1 to the side wall 211 of the filter unit 21. In other words, since the intensity of the light beam L1 emitted to the first area Z1 is greater, and the intensity of the light beam L1 emitted to the third area Z3 is lower, the first mean refractive index of the first area Z1 is greater than the third mean refractive index of the third area Z3.

Figure 5:
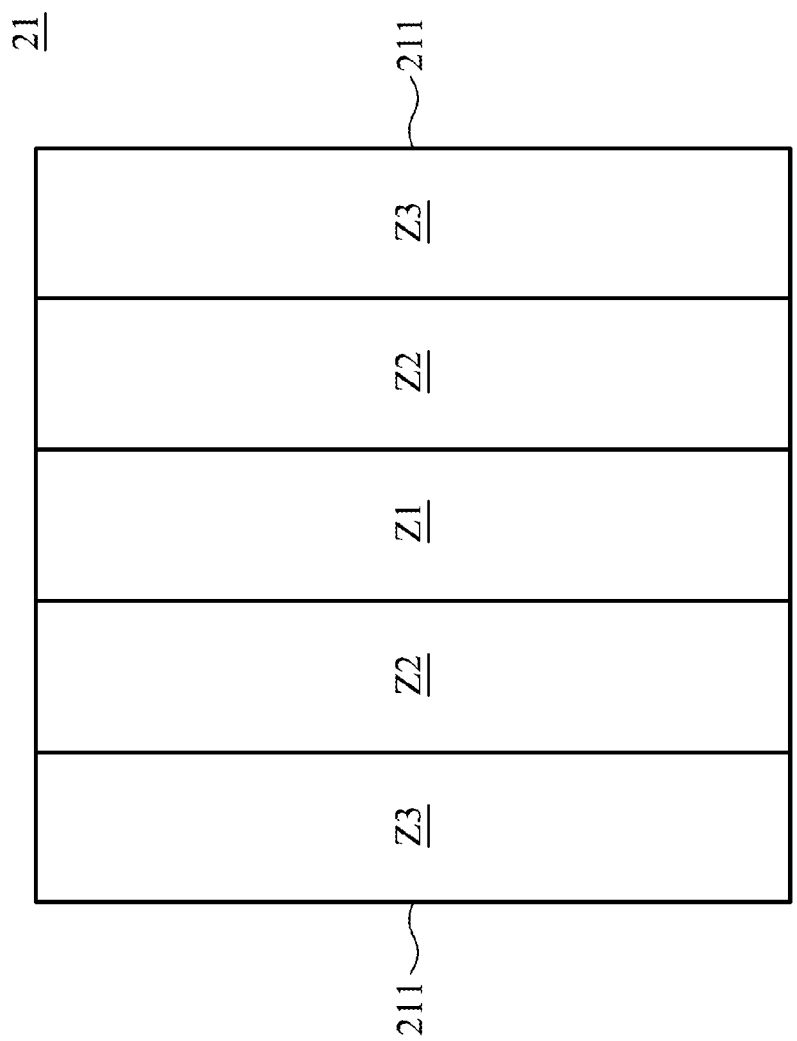
FIG. 5 is a top view of a filter unit during an intermediate stage in accordance with the first embodiment of the present disclosure.

FIG. 5 is a top view of one filter unit 21 during an intermediate stage in accordance with the first embodiment of the present disclosure. In this embodiment, the hole B11 is a narrow shape or a rectangle shape. As shown in FIGS. 4 and 5, the first area Z1, the second area Z2, and the third area Z3 are rectangles, and parallel to each other.

Figure 6:
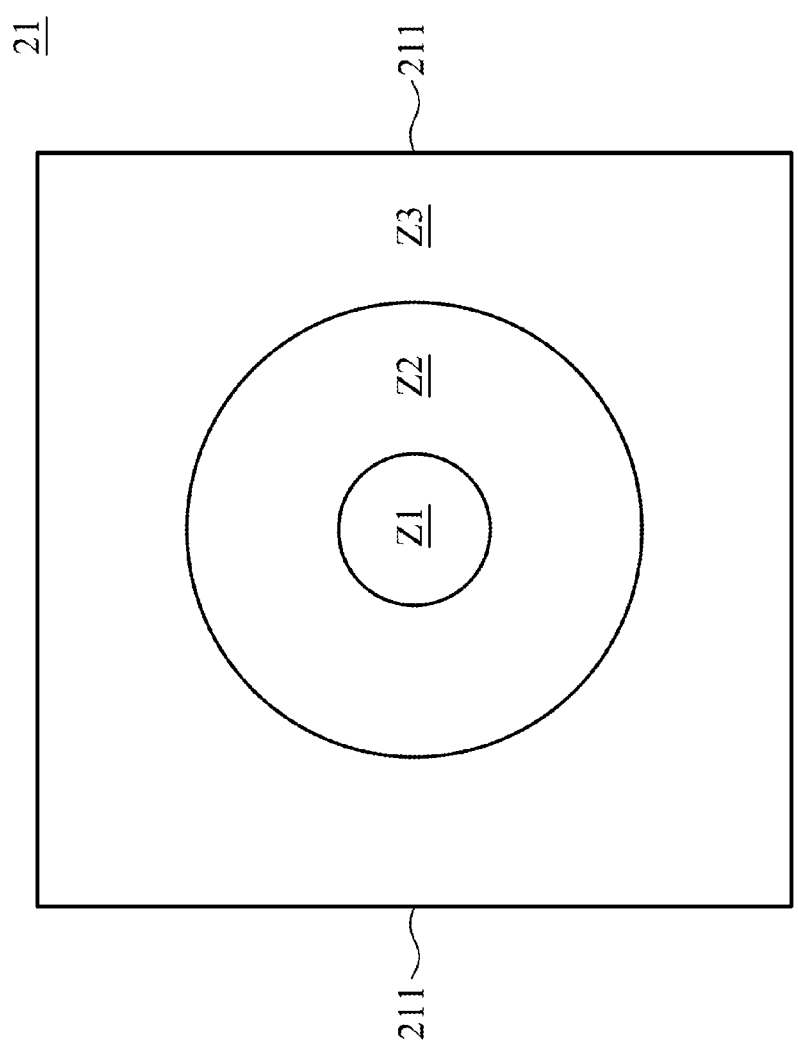
FIG. 6 is a top view of a filter unit during an intermediate stage in accordance with a second embodiment of the present disclosure.

FIG. 6 is a top view of one filter unit 21 during an intermediate stage in accordance with a second embodiment of the present disclosure. In this embodiment, the hole is a circular shape. As shown in FIGS. 4 and 6, the first area Z1 is a cylindrical shape extending along the central vertical axis AX1. The second area Z2 is around the first area Z1, and the third area Z3 is around the second area Z2.

Figure 7:
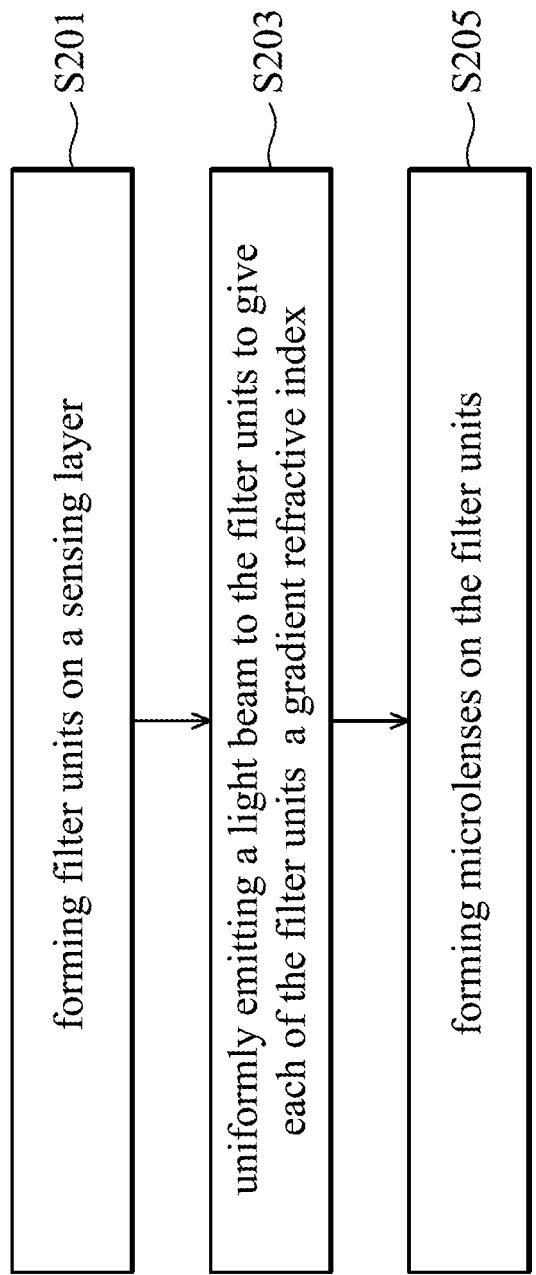
FIG. 7 is a flow chart manufacturing method of the image sensor in accordance with a third embodiment of the present disclosure.
Figure 8:
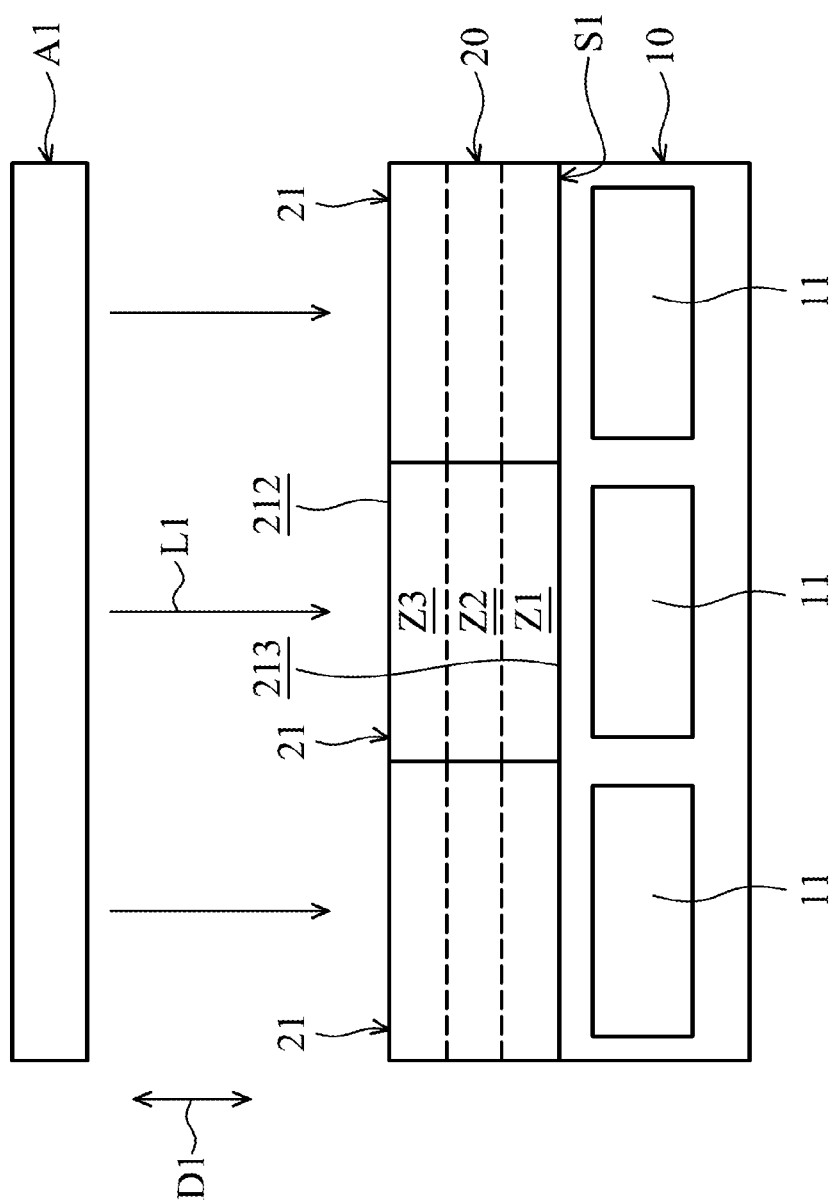
FIG. 8 is a schematic view of the manufacturing method of the image sensor during an intermediate stage in accordance with the third embodiment of the present disclosure.
Figure 9:
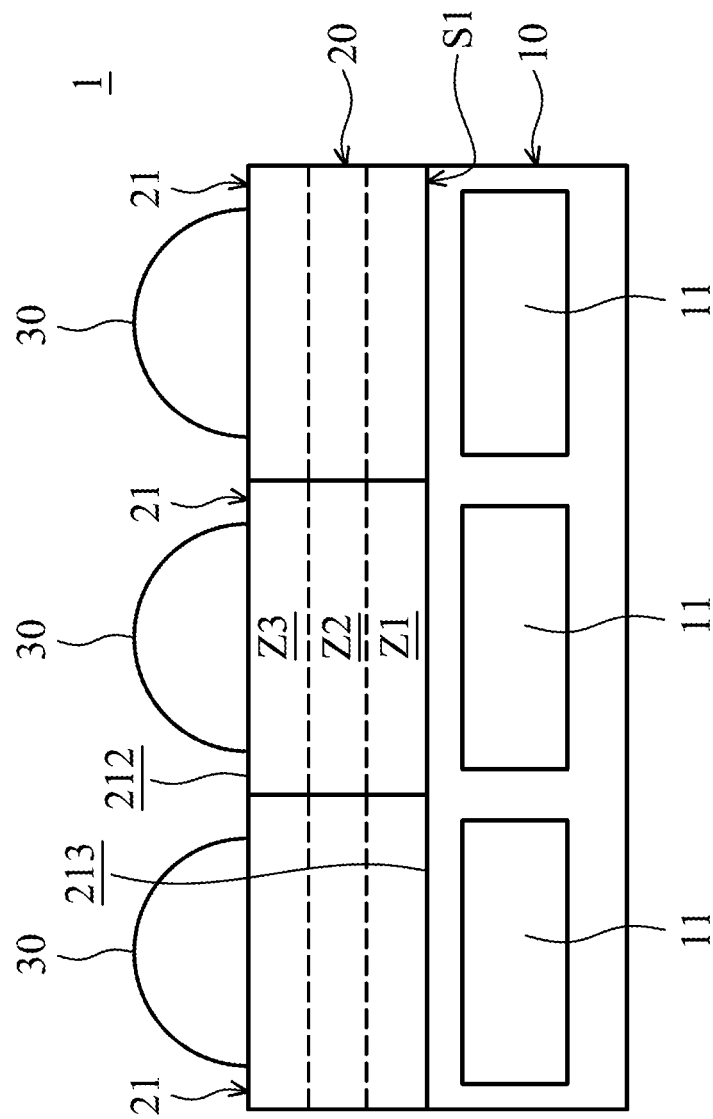
FIG. 9 is a cross-sectional view of the image sensor in accordance with the third embodiment of the present disclosure.

FIG. 7 is a flow chart manufacturing method of the image sensor 1 in accordance with a third embodiment of the present disclosure. FIG. 8 is a schematic view of the manufacturing method of the image sensor 1 during an intermediate stage in accordance with the third embodiment of the present disclosure. FIG. 9 is a cross-sectional view of the image sensor 1 in accordance with the third embodiment of the present disclosure.

In step S201, the filter units 21 of the filter layer 20 are formed on the sensing layer 10. In step S203, a light beam L1 is uniformly emitted to the filter units 21 to give each filter unit 21 a gradient refractive index.

As shown in FIG. 8, the light source A1 is disposed upon the filter layer 20. The light source A1 uniformly emits the light beam L1 to the filter units 21 of the filter layer 20 along the emitting direction D1.

Each the of filter units 21 has a top surface 212 and a bottom surface 213 opposite to the top surface 212. The top surface 212 faces the light source A1 and is parallel to the boundary surface S1. The bottom surface 213 is located at the boundary surface S1, and is disposed on the sensing layer 10. Since the intensity of the light beam L1 emitted to the filter unit 21 is gradually decreased from the top surface 212 to the bottom surface 213, the gradient refractive index is gradually increased from the bottom surface 213 to the top surface 212.

In step S205, as shown in FIG. 9, the microlens 30 is formed on the filter units 21. The top surface 212 is connected to the microlens 30. The first area Z1 is adjacent to the sensing layer 10. The third area Z3 is adjacent to the microlens 30. The third area Z3 is between the first area Z1 and the second area Z2. The first area Z1, the second area Z2, and the third area Z3 are layered shapes and stacked on each other. The first area Z1, the second area Z2, and the third area Z3 are parallel to the boundary surface S1 and parallel to each other.

The first mean refractive index of the first area Z1 is greater than the second mean refractive index of the second area Z2, and the second mean refractive index is greater than the third mean refractive index of the third area Z3.

Figure 10:
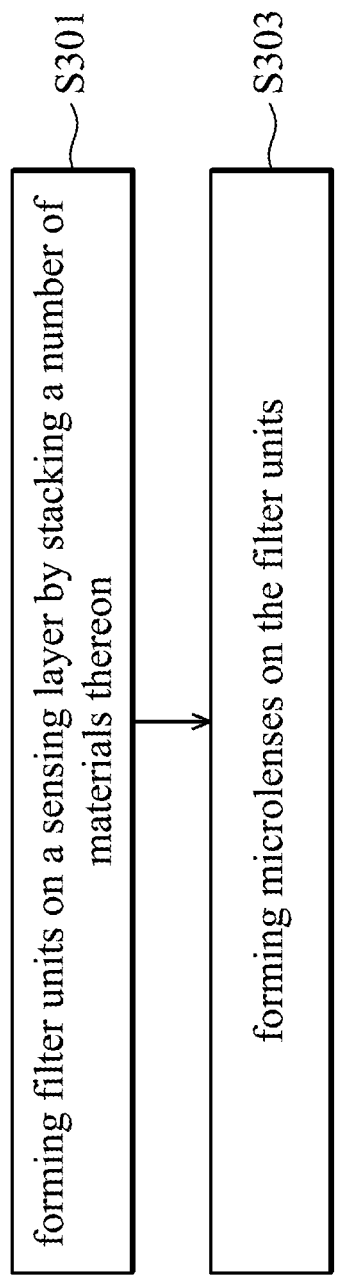
FIG. 10 is a flow chart manufacturing method of the image sensor in accordance with a fourth embodiment of the present disclosure.
Figure 11:
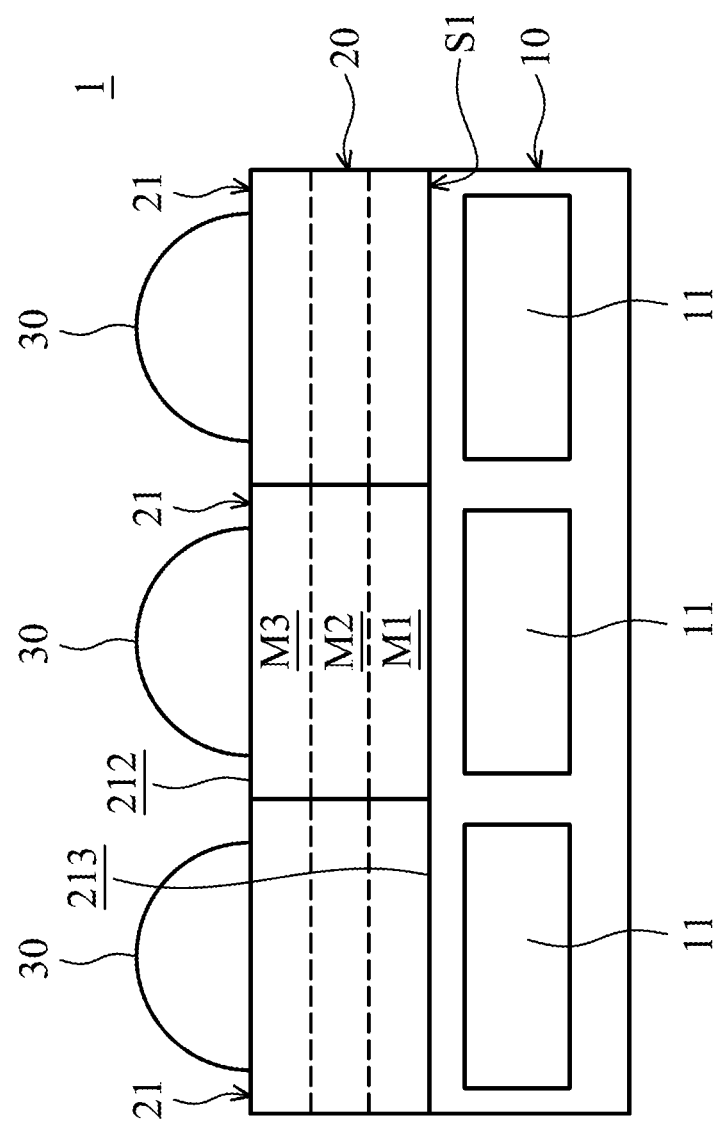
FIG. 11 is a cross-sectional view of the image sensor in accordance with the fourth embodiment of the present disclosure.

FIG. 10 is a flow chart manufacturing method of the image sensor 1 in accordance with a fourth embodiment of the present disclosure. FIG. 11 is a cross-sectional view of the image sensor 1 in accordance with the fourth embodiment of the present disclosure.

In step S301, the filter units 21 of the filter layer 20 are formed on the sensing layer 10 by stacking a number of materials M1, M2 and M3 on the filter layer 20. In some embodiments, the materials M1, M2 and M3 are made by a chemical vapor deposition (CVD) process. In step S302, the microlenses 30 are formed on the filter units 21.

As shown in FIG. 11, the filter unit 21 includes the stacked materials M1, M2 and M3, and the materials M1, M2 and M3 are layered. The material M2 is stacked on the material M1, and the material M3 is stacked on the material M2. The material M1 connected to the filter layer 20, the material M3 connected to the microlens 30, and the material M2 is between the material M1 and the material M3.

Each of the materials M1, M2 and M3 has a refractive index different from the adjacent material. In this embodiment, each of the refractive indexes of the materials M2 and M3 is lower than the refractive index of the material below it. For example, the refractive index of the material M1 is about 1.7, the refractive index of the material M2 is about 1.65, and the refractive index of the material M3 is about 1.6. In some embodiments, the materials M1, M2 and M3 are different.

Figure 12:
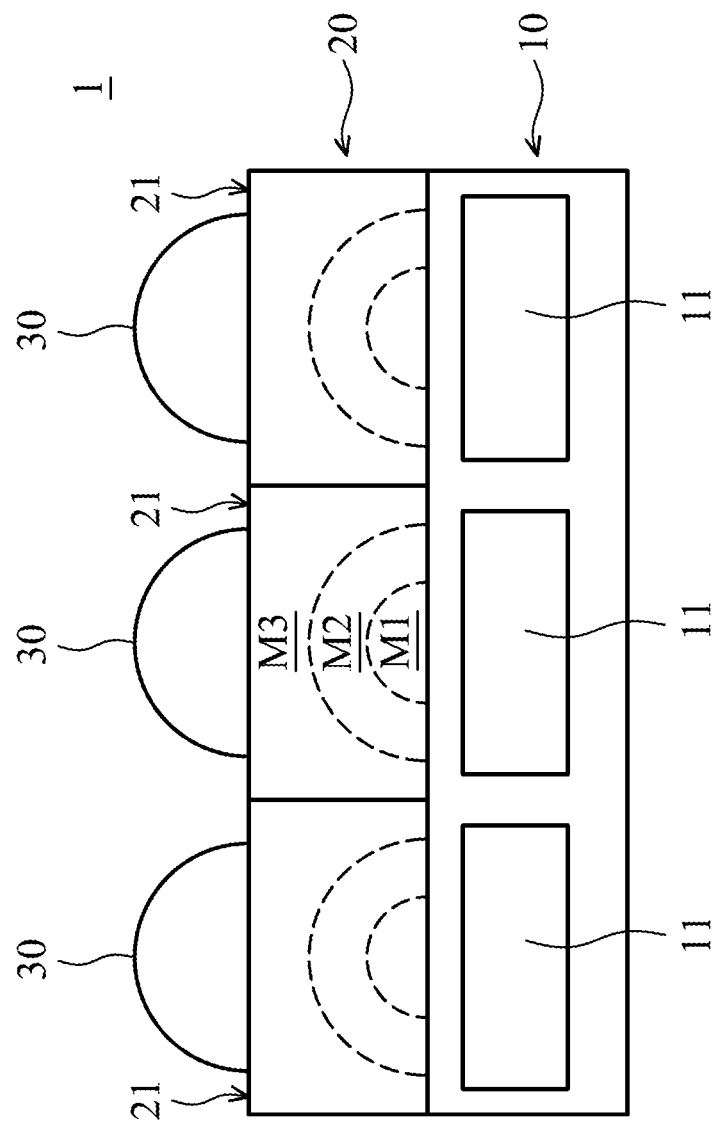
FIG. 12 is a cross-sectional view of the image sensor in accordance with a fifth embodiment of the present disclosure.

FIG. 12 is a cross-sectional view of the image sensor 1 in accordance with a fifth embodiment of the present disclosure. As shown in FIG. 12, the material M1 is a bump-shaped material arranged under the materials M2 and M3, and thus the shape of the materials M2 and M3 correspond to a contour of the bump-shaped material M1. In the embodiment, the materials M1, M2 and M3 have curved profiles.

Figure 13:
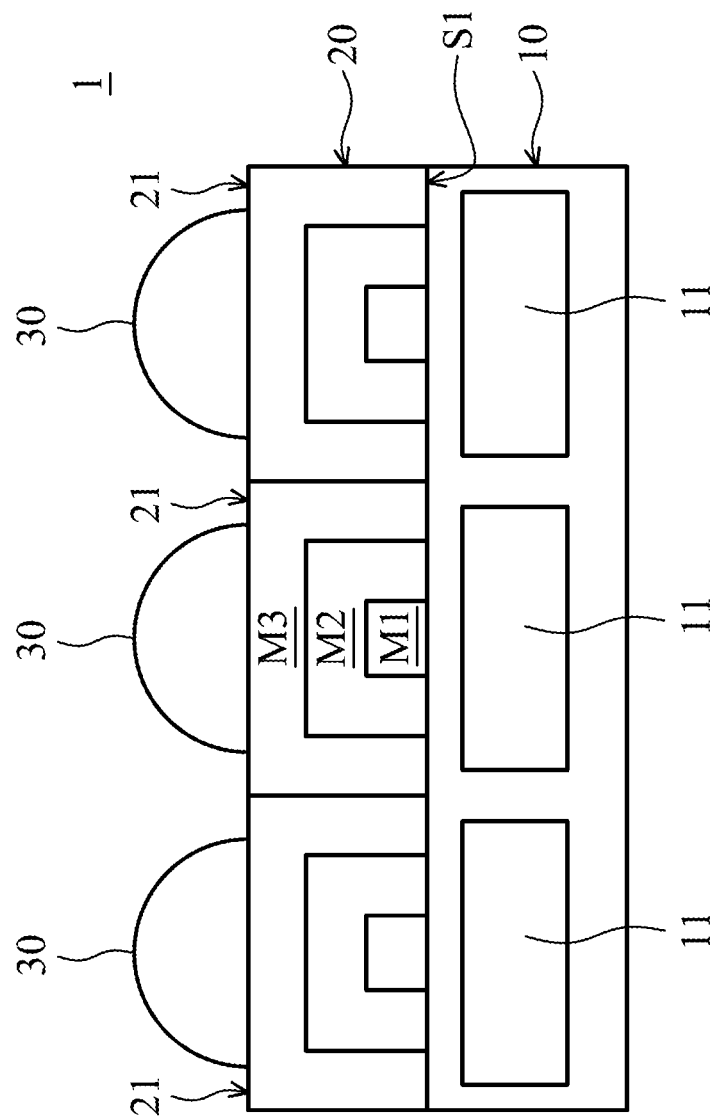
FIG. 13 is a cross-sectional view of the image sensor in accordance with a sixth embodiment of the present disclosure.

FIG. 13 is a cross-sectional view of the image sensor 1 in accordance with a sixth embodiment of the present disclosure. The difference between the sixth embodiment and the fifth embodiment is that the materials M1, M2 and M3 have polygonal profiles.

By the filter unit 21, for example, the QE (Quantum Efficiency) peak is improved about 2.7% to 5.4% when the difference between the maximum value and the minimum value of the gradient refractive index is about 0.1. In general, the quantum efficiency may apply to the incident photon to converted electron (IPCE) ratio of the image sensor, and greater quantum efficiency corresponds to greater sensitivity of the image sensor. The sensitivity of the green filter unit 21b to a light at 3200K is improved about 0.3%, for example. Therefore, the sensitivity of the image sensor 1 is improved.

Moreover, the cross talk of the green filter unit 21b irradiated by a blue light is improved about 5% to 9%, for example. The cross talk of the red filter unit 21a irradiated by a green light is improved about 1% to about 2%. The cross talk of the blue filter unit 21c irradiated by a green light is improved about 0.6% to about 2%. Therefore, the quality of the image signal generated by the image sensor 1 is improved.

In conclusion, the sensitivity of the image sensor of the present disclosure is improved by the filter unit having a gradient refractive index. Therefore, the image signals generated by the image sensor are improved, especially in a low-luminance environment.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor, comprising:
    a sensing layer;
    a filter unit disposed on the sensing layer; and
    a microlens disposed on the filter unit,
    wherein the filter unit includes a single material having a gradient refractive index.

2. The image sensor as claimed in claim 1, wherein the gradient refractive index is in a range from 1.4 to 1.9.

3. The image sensor as claimed in claim 1, wherein the gradient refractive index has a maximum value and a minimum value, and the difference between the maximum value and the minimum value is in a range from 0.07 to 0.5.

4. The image sensor as claimed in claim 1, wherein the microlens comprises photopolymer and comprises a single refractive index.

5. The image sensor as claimed in claim 1, wherein the filter unit comprises photopolymer.

6. The image sensor as claimed in claim 1, wherein the gradient refractive index is symmetric and decreases from the central vertical axis to a side wall of the filter unit.

7. The image sensor as claimed in claim 1, wherein the filter unit has a bottom surface disposed on the sensing layer and has a top surface opposite to the bottom surface and connected to the microlens, and the gradient refractive index gradually increases from the bottom surface to the top surface.

8. A manufacturing method of image sensors, comprising:
    forming a filter unit on a sensing layer;
    emitting a light beam to the filter unit to give the filter unit a gradient refractive index; and
    forming a microlens on the filter unit.

9. The manufacturing method of image sensors as claimed in claim 8, comprising emitting the light beam to the filter unit via a mask, wherein the mask has a hole corresponding to a center area of the filter unit.

10. The manufacturing method of image sensors as claimed in claim 9, wherein the gradient refractive index is symmetric and decreases from the central vertical axis to a side wall of the filter unit.

11. The manufacturing method of image sensors as claimed in claim 8, comprising uniformly emitting the light beam to the filter unit.

12. The manufacturing method of image sensors as claimed in claim 9, wherein the gradient refractive index increases from a bottom surface of the filter unit to a top surface of the filter unit, and the bottom surface is disposed on the sensing layer.

13. The image sensor as claimed in claim 1, wherein the sensing layer includes a substrate having sensing units embedded therein.

14. The image sensor as claimed in claim 1, wherein the filter unit is a color filter.

* * * * *